US006661288B2

(12) United States Patent
Morgan et al.

(10) Patent No.: US 6,661,288 B2
(45) Date of Patent: Dec. 9, 2003

(54) APPARATUS FOR EFFECTING HIGH SPEED SWITCHING OF A COMMUNICATION SIGNAL

(75) Inventors: Mark Morgan, Allen, TX (US); Srikanth Gondi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/072,862

(22) Filed: Feb. 9, 2002

(65) Prior Publication Data

US 2003/0151431 A1 Aug. 14, 2003

(51) Int. Cl.[7] .................................................. H03F 3/45
(52) U.S. Cl. ....................... 330/258; 330/259; 330/260; 330/261; 330/296; 330/297; 330/9
(58) Field of Search ................................. 330/258, 259, 330/260, 261, 296, 297, 9

(56) References Cited

U.S. PATENT DOCUMENTS 5,821,812 A * 10/1998 Park et al. .................. 330/260

FOREIGN PATENT DOCUMENTS

JP 200223970 * 8/2000

OTHER PUBLICATIONS

You et al. "Am Improved Jail Current Source for Low Voltage Applications" IEEE Journal of Solid–State Circuits, vol. 32 Issue 8 Aug. 1997, pp 1173–1180.*

* cited by examiner

Primary Examiner—Michael B Shingleton
(74) Attorney, Agent, or Firm—W. Daniel Swayze, Jr.; W. James Brady; Frederick J. Telecky, Jr.

(57) ABSTRACT

An apparatus for effecting high speed switching of a communication signal between a first component and a second component includes: (a) a switching circuit configured for receiving the signal from the first component that includes a plurality of switch elements responding to the signal to produce an interim signal that is substantially a model of the signal; (b) a follower circuit having an input locus coupled with the switching circuit for receiving the interim signal; the follower circuit has an output locus configured for presenting an output signal that is substantially duplicating the interim signal; and (c) a control circuit coupling the follower circuit with the switching circuit and receives a feedback signal from the follower circuit representative of the output signal; the control circuit responds to the feedback signal to effect operation of the switching circuit to control at least one first parameter relating to the interim signal.

18 Claims, 4 Drawing Sheets

APPARATUS FOR EFFECTING HIGH SPEED SWITCHING OF A COMMUNICATION SIGNAL

BACKGROUND OF THE INVENTION

The present invention is directed to communication signal driver apparatuses, and especially to communication signal driver apparatuses that handle high-speed signal traffic between components.

High speed chip-to-chip signaling is a significant bottleneck in the design of systems such as motherboards, optical transmission links, intelligent network hubs, routers and other systems. Some standards have been established to apply to high speed signal handling applications including, for example, low voltage differential signaling (LVDS) and positive emitter-coupled logic (PECL). These standards are designed to achieve high-speed signal handling with low power dissipation and low electromagnetic interference (EMI).

Inter-chip high-speed communication is limited by the performance of driver and receiver circuits at the interface of communicating chips. In particular, it is important for driver apparatuses to exhibit high-speed signal handling as well as low power dissipation while operating using low supply voltages. Other desirable attributes for a driver apparatus are scalability and variability of the apparatus for satisfying various standards to which driver apparatuses may be required to adhere.

SUMMARY OF THE INVENTION

In a communication system, the driver speed is not only limited by the external load that is driven, but also by the structure of the circuitry used to drive the external loads. In its preferred embodiment, the present invention is an apparatus, such as a driver circuit, for conveying a communication signal. The apparatus is preferably constructed to include a switching circuit, a follower circuit that follows the switching circuit and a control circuit. The control circuit provides a feedback signal from the follower circuit to the switching circuit to control at least one parameter associated with operation of the switching circuit. The switching circuit is preferably constructed as a differential switching stage with resistive loads. A bias current through the resistive loads establishes the required differential voltage at the output of the apparatus. The switching circuit also controls the common mode voltage at the output of the apparatus. The follower circuit translates the differential voltage generated by the switching circuit to the output of the apparatus. The control circuit senses the common mode voltage at the output of the apparatus and provides an amplified error signal to the switching circuit.

This arrangement provides for high-speed operation because of low output impedance of the follower circuit (i.e., the output stage of the apparatus) and because there is no switching effected in the output stage of the apparatus. Because the entire apparatus may be advantageously constructed with minimal stacking of devices and with low voltage drops within the circuitry, the apparatus is particularly well suited for low voltage applications. Further, since the output stage (i.e., the follower circuit) includes no switching devices, there is no requirement for large currents in the follower circuit for high speed operation. The preferred output stage (i.e., follower circuit) construction also facilitates either high or low output common-mode voltage operation. Circuit parameters and particular components in the apparatus may easily be varied to satisfy particular requirements for various standards including, for example, output differential voltage, speed, and power dissipation.

An apparatus for effecting high speed switching of a communication signal between a first component and a second component includes: (a) a switching circuit configured for receiving the communication signal from the first component; the switching circuit includes a plurality of switch elements responding to the communication signal to produce an interim signal that is substantially a model of the communication signal; (b) a follower circuit having an input locus coupled with the switching circuit for receiving the interim signal; the follower circuit has an output locus configured for presenting an output signal that is substantially duplicating the interim signal; and (c) a control circuit coupling the follower circuit with the switching circuit; the control circuit receives a feedback signal from the follower circuit that is representative of the output signal; the control circuit responds to the feedback signal to effect operation of the switching circuit to control at least one first parameter relating to the interim signal.

It is therefore an object of the present invention to provide an apparatus for conveying a signal that exhibits high-speed signal handling and low power dissipation.

It is a further object of the present invention to provide an apparatus for conveying a signal that can operate using low supply voltages.

It is yet a further object of the present invention to provide an apparatus for conveying a signal that exhibits scalability and variability for satisfying various standards.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

In a typical communication system a driver apparatus is commonly part of a transmitter block, or component. The driver apparatus is the interface to the transmission media by which the communication signals are conveyed. It is the driver apparatuses in a system that usually limit the data rates that can be handled by a system operating according to a given standard because of inherent limitations in the driver apparatuses. Conventional driver apparatus designs have so far been able to meet the demands of ever increasing data rate requirements, but driver apparatus designs now in use are bothersome bottlenecks for even faster data rates of signal transmission.

Figure 1:
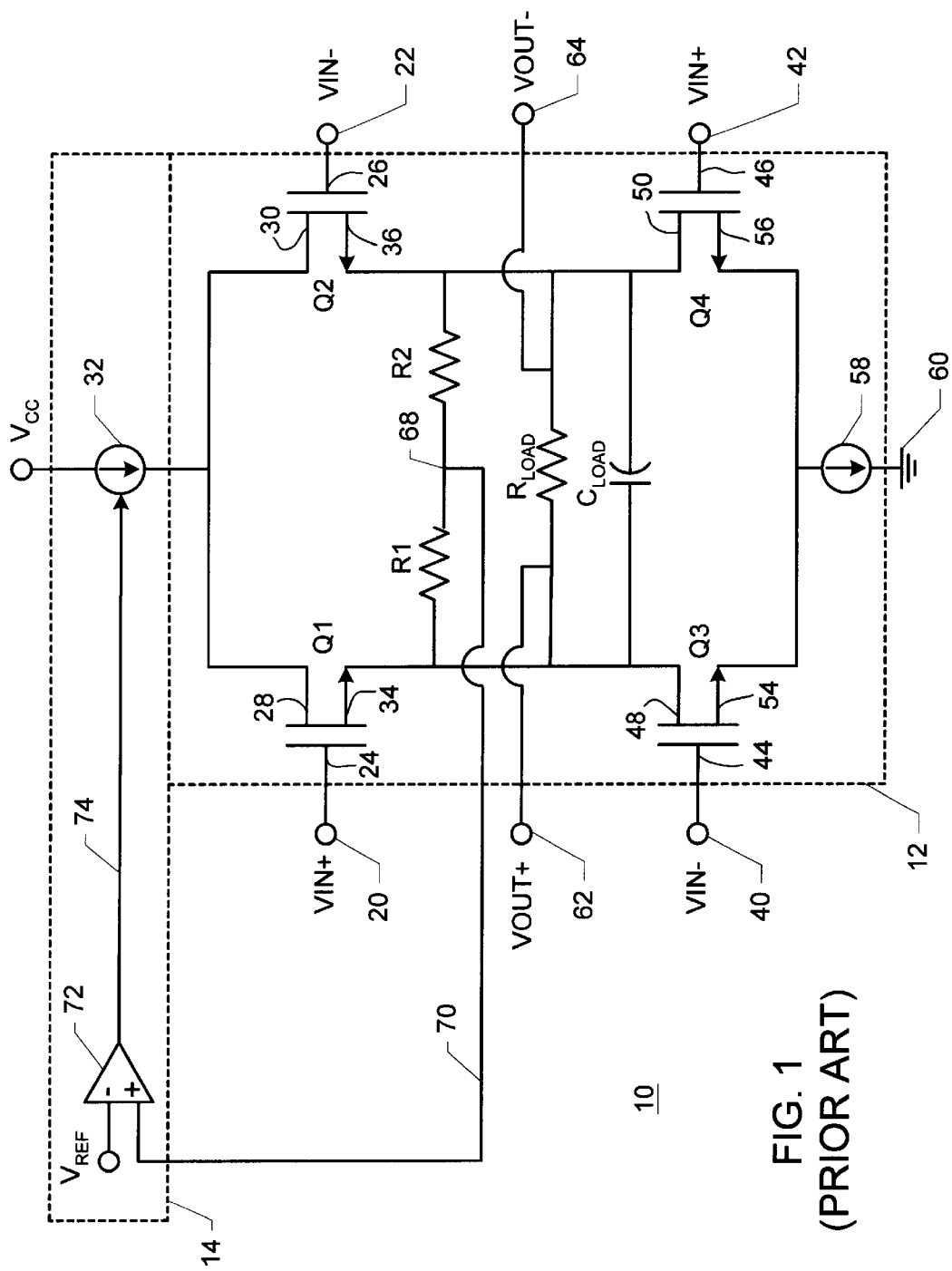
FIG. 1 is an electrical schematic diagram of a first embodiment of a prior art communication switching apparatus.

FIG. 1 is an electrical schematic diagram of a first embodiment of a prior art communication switching apparatus. In FIG. 1, a driver apparatus 10 includes a switching circuit 12 and a control circuit 14. Switching circuit 12 includes first input loci 20, 22. The signal conveyed by driver apparatus 10 is a differential signal so that the positive component VIN+ of the input signal is received at first input locus 20, and the negative component VIN− of the input signal is received at first input locus 22. First input loci 20, 22 are coupled with gates 24, 26 of switching transistors Q1, Q2. Drains 28, 30 of switching transistors Q1, Q2 are coupled with a current source 32. Current source 32 is coupled to receive supply voltage Vcc. Resistors R1, R2 are coupled in series across sources 34, 36 of switching transistors Q1, Q2.

Switching circuit 12 further includes second input loci 40, 42. The positive component VIN+ of the differential input signal is received at second input locus 42, and the negative component VIN− of the differential input signal is received at second input locus 40. Second input loci 40, 42 are coupled with gates 44, 46 of switching transistors Q3, Q4. Drain 48 of switching transistor Q3 is coupled with source 34 of switching transistor Q1. Drain 50 of switching transistor Q4 is coupled with source 36 of switching transistor Q2. Thus resistors R1, R2 are also coupled in series across drains 48, 50 of switching transistors Q3, Q4. Sources 54, 56 are coupled with a current source 58. Current source 58 is coupled with ground 60. A load resistor $R_{LOAD}$ and a load capacitor $C_{LOAD}$ are coupled in parallel across sources 34, 36 of switching transistors Q1, Q2 and across drains 48, 50 of switching transistors Q3, Q4.

Output loci 62, 64 are coupled from adjacent opposite ends of load resistor $R_{LOAD}$. Positive component VOUT+ of the differential output signal is presented at output locus 62. Negative component VOUT− of the differential output signal is presented at output locus 64.

A feedback line 70 is coupled with a juncture 68 between resistors R1, R2. Feedback line 70 is coupled with an amplifier 72 in control circuit 14. Amplifier 72 also receives a reference voltage $V_{REF}$. Amplifier 72 presents an amplified error signal at a line 74 representing the difference between a signal appearing on feedback line 70 and reference voltage $V_{REF}$. Line 74 is coupled with current source 32. Amplified error signals on line 74 are employed to effect control of current source 32, thereby controlling current through switching transistors Q1, Q2, Q3, Q4.

In apparatus 10 switching transistors Q1, Q2, Q3, Q4 act as switches in a manner whereby either switching transistors Q1, Q4 or switching transistors Q2, Q3 provide a path for current flow to generate the required differential voltage across load resistor $R_{LOAD}$. In essence, switching transistors Q1, Q2, Q3, Q4 operate in the manner of an H-bridge network. Resistors R1, R2 are used to sense the common-mode voltages at output loci 62, 64 for provision via feedback line 70 to amplifier 72. Amplified error signals on line 74 generated by amplifier 72 control current source 32 in order to effect control of the output common mode voltage measured at output loci 62, 64.

A significant disadvantage with the architecture of apparatus 10 is that switching transistors Q1, Q2, Q3, Q4 increase the voltage rise and fall time at output loci 62, 64, which in turn affects the data rate of apparatus 10. Voltage rise and fall times of switching transistors Q1, Q2, Q3, Q4, are greater when sources 34, 36, 54, 56 or drains 28, 30, 48, 50 see large resistances or capacitances. In most applications in which apparatus 10 is employed, even though load resistance may be small, load capacitance will typically be quite large, often on the order of at least 1 pF (picoFarad). One partial solution to these shortcomings of apparatus 10 could be to increase bias currents through switching transistors Q1, Q2, Q3, Q4 (e.g., by reducing load resistor $R_{LOAD}$) to increase switching speed for switching transistors Q1, Q2, Q3, Q4. However, such a remedy would require large increments in power dissipation. Power dissipation would increase because of the increase in bias currents as well as because the larger bias currents would require larger switching transistors Q1, Q2, Q3, Q4. Larger switching transistors Q1, Q2, Q3, Q4 mean that circuitry driving apparatus 10 inherently would dissipate more power than if the transistors were smaller.

In today's market the trend in products is toward lower supply voltages in order to create smaller, less battery-hungry devices. Apparatus 10 suffers from yet a further disadvantage in that it will operate more slowly for lower power supply voltages. This is a serious disadvantage in today's marketplace.

Figure 2:
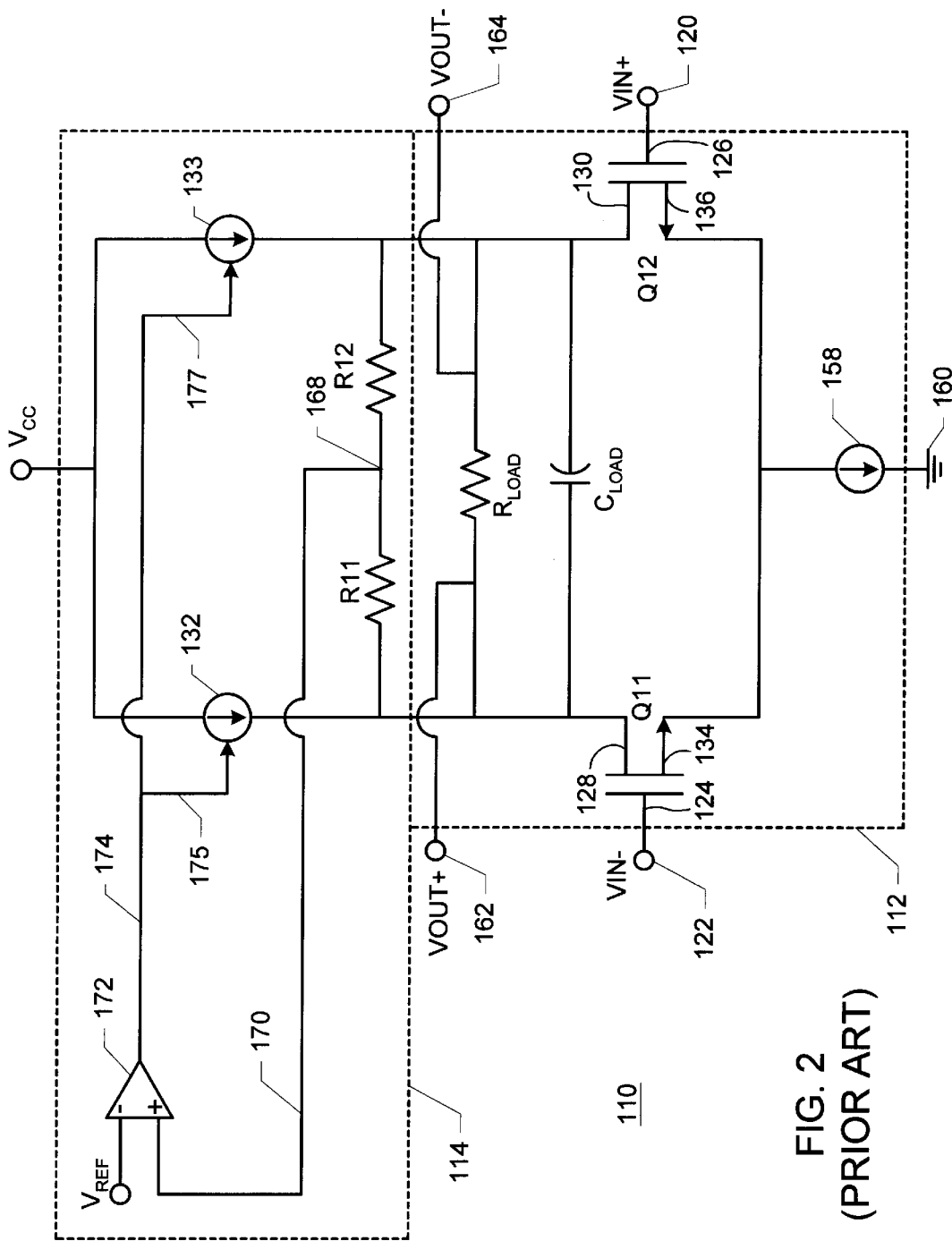
FIG. 2 is an electrical schematic diagram of a second embodiment of a prior art communication switching apparatus.

FIG. 2 is an electrical schematic diagram of a second embodiment of a prior art communication switching apparatus. In FIG. 2, a driver apparatus 110 includes a switching circuit 112 and a control circuit 114. Switching circuit 112 includes input loci 120, 122. The signal conveyed by driver apparatus 110 is a differential signal so that the positive component VIN+ of the input signal is received at input locus 120, and the negative component VIN− of the input signal is received at input locus 122. Input loci 120, 122 are coupled with gates 124, 126 of switching transistors Q11, Q12. Drain 128 of switching transistor Q11 is coupled with a current source 132. Drain 130 of switching transistor Q12 is coupled with a current source 133. Current sources 132, 133 are coupled to receive supply voltage Vcc. Resistors R11, R12 are coupled in series across sources 134, 136 of switching transistors Q11, Q12. Sources 134, 136 are coupled with a current source 158. Current source 158 is coupled with ground 160.

A load resistor $R_{LOAD}$ and a load capacitor $C_{LOAD}$ are coupled in parallel across drains 128, 130 of switching transistors Q11, Q12. Output loci 162, 164 are coupled from adjacent opposite ends of load resistor $R_{LOAD}$. Positive component VOUT+ of the differential output signal is presented at output locus 162. Negative component VOUT− of the differential output signal is presented at output locus 164.

A feedback line 170 is coupled with a juncture 168 between resistors R11, R12. Feedback line 170 is coupled with an amplifier 172 in control circuit 114. Amplifier 172 also receives a reference voltage $V_{REF}$. Amplifier 172 presents an amplified error signal at a line 174 representing the difference between a signal appearing on feedback line 170 and reference voltage $V_{REF}$. Line 174 is coupled with control lines 175, 177 for controlling current sources 132, 133. Amplified error signals on lines 174, 175, 177 are employed to effect control of current sources 132, 133 thereby controlling current through switching transistors Q11, Q12.

In apparatus 110 switching transistors Q11, Q12 switch on alternately and therefore alternately provide a path for current flow to generate the required differential voltage across load resistor $R_{LOAD}$. Resistors R11, R12 are used to sense the common-mode voltages at output loci 162, 164 for provision via feedback line 170 to amplifier 172. Error signals on lines 174, 175, 177 generated by amplifier 172 control current sources 132, 133 in order to effect control of the output common mode voltage measured at output loci 162, 164.

Apparatus 110 suffers from disadvantages similar to the disadvantages described in connection with apparatus 10 (FIG. 1). Because of the high impedance seen at the output of apparatus 110, there are long rise and fall times, thereby limiting data rates that can be handled by apparatus 110. Apparatus 110 is improved over apparatus 10 (FIG. 1) in that apparatus 110 operates at higher speeds for lower supply voltages.

Figure 3:
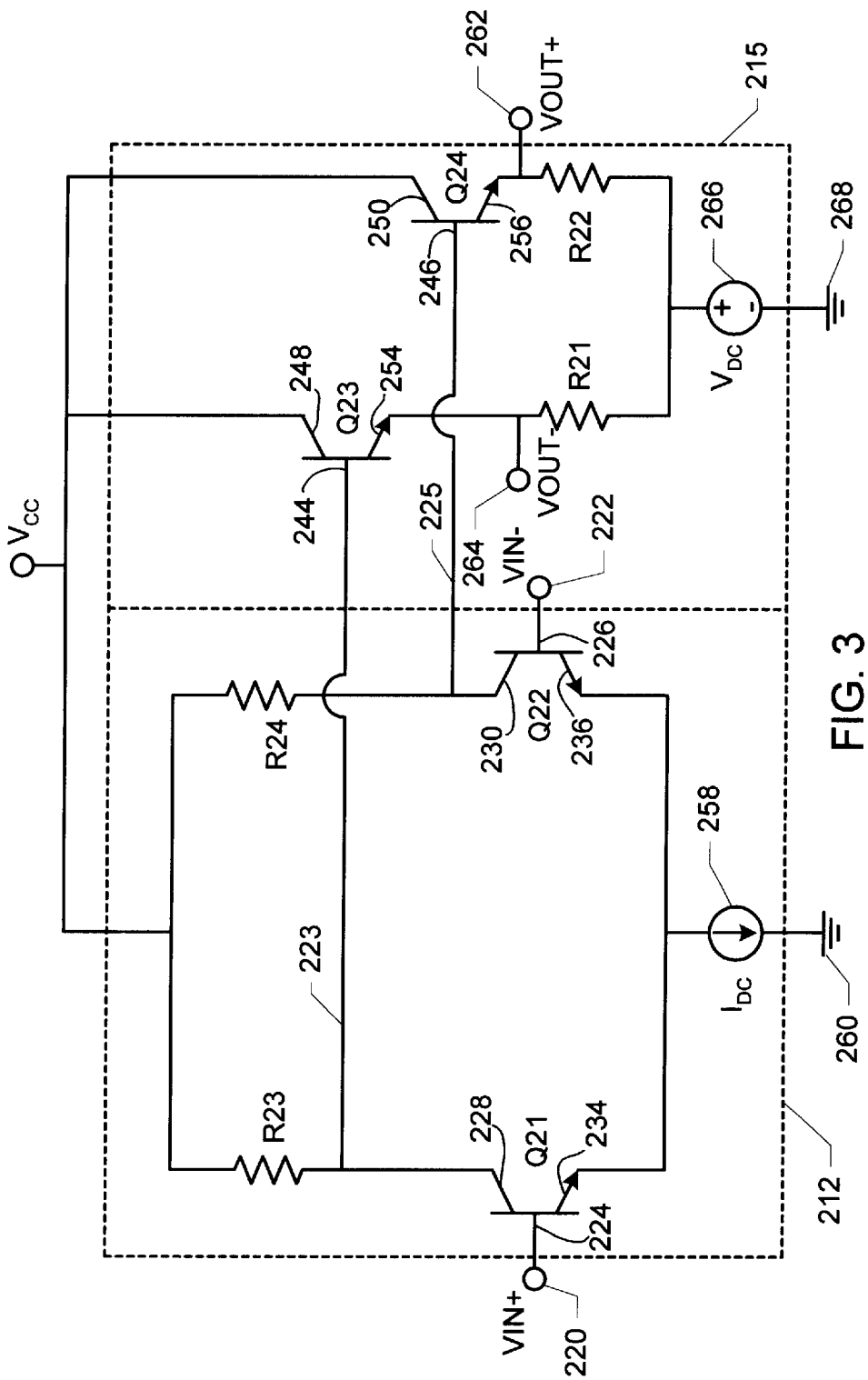
FIG. 3 is an electrical schematic diagram of a third embodiment of a prior art communication switching apparatus.

FIG. 3 is an electrical schematic diagram of a third embodiment of a prior art communication switching apparatus. In FIG. 3, a driver apparatus 210 specifically suited for operation under the PECL (positive emitter-coupled logic) standard includes a switching circuit 212 and an output circuit 215. Switching circuit 212 includes input loci 220, 222. The signal conveyed by driver apparatus 210 is a differential signal so that the positive component VIN+ of the input signal is received at input locus 220, and the negative component VIN− of the input signal is received at input locus 222. Input loci 220, 222 are coupled with bases 224, 226 of switching transistors Q21, Q22. Collector 228 of switching transistor Q21 is coupled with a resistor R23 in series with a supply voltage Vcc. Collector 230 of switching transistor Q22 is coupled with a resistor R24 in series with a supply voltage Vcc. Resistors R23, R24 limit current spikes when switching transistors Q21, Q22 switch on and off. Emitters 234, 236 of switching transistors Q21, Q22 are coupled with a current source 258. Current source 258 is coupled with ground 260.

Indicator signals indicating whether a respective switching transistor Q21, Q22 is on or off are conveyed via lines 223, 225 to output circuit 215. Output circuit 215 includes follower transistors Q23, Q24. Collector 248 of follower transistor Q23 is coupled for receiving supply voltage Vcc. Collector 250 of follower transistor Q24 is coupled for receiving supply voltage Vcc. Emitter 254 of follower transistor Q23 is coupled with a resistor R21 in series with a DC voltage source 266 and ground 268. Emitter 256 of follower transistor Q24 is coupled with a resistor R22 in series with DC voltage source 266 and ground 268.

Output locus 264 is coupled with emitter 254 of follower transistor Q23. Output locus 262 is coupled with emitter 256 of follower transistor Q24. Positive component VOUT+ of the differential output signal is presented at output locus 262. Negative component VOUT− of the differential output signal is presented at output locus 264. Since base 244 of follower transistor Q23 is coupled with line 223 and base 246 of follower transistor Q24 is coupled with line 225, follower transistors Q23, Q24 are controlled by signals appearing on lines 223, 225. Recall that signals appearing on lines 223, 225 represent whether switching transistors Q21, Q22 are on or off. As a result, output circuit 215 follows switching circuit 212 in operating follower transistors Q23, Q24. No control circuitry is provided for apparatus 210. There is no on-chip locus available for determining the common mode voltage of the output from apparatus 210.

Apparatus 210 is an example of a driver apparatus that is specifically designed for use with the PECL standard. Accordingly, the appropriate load resistor and load capacitor are not resident on-chip in apparatus 210. Appropriate load resistance and load capacitance must be provided off-chip when using apparatus 210 to establish the circuit parameters required by the PECL standard, such as impedance value of the load resistance, current flow through the load and other parameters. Apparatus 210 operates at higher data rates than apparatus 10 (FIG. 1) and apparatus 110 (FIG. 2).

Figure 4:
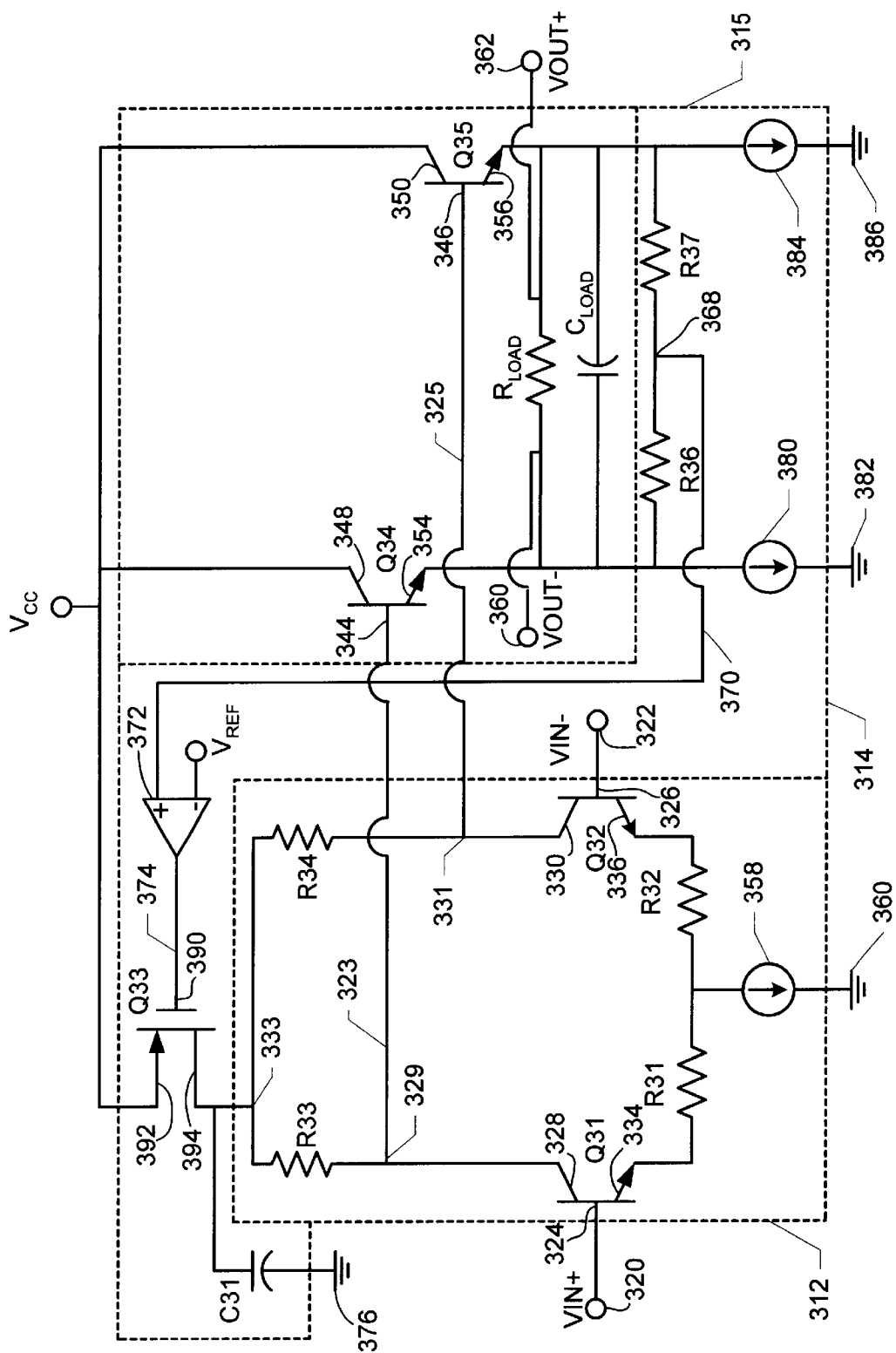
FIG. 4 is an electrical schematic diagram of a communication switching apparatus configured according to the present invention.

FIG. 4 is an electrical schematic diagram of a communication switching apparatus configured according to the present invention. In FIG. 4, a driver apparatus 310 includes a switching circuit 312, a follower circuit 315 and a control circuit 314. Switching circuit 312 includes input loci 320, 322. The signal conveyed by driver apparatus 310 is a differential signal so that the positive component VIN+ of the input signal is received at input locus 320, and the negative component VIN− of the input signal is received at input locus 322. Input loci 320, 322 are coupled with bases 324, 326 of switching transistors Q31, Q32. Collector 328 of switching transistor Q31 is coupled with a resistor R33 in series with control circuit 314. Collector 330 of switching transistor Q32 is coupled with a resistor R34 in series with control circuit 314. Emitter 334 of switching transistor Q31 is coupled with a resistor R31 in series with a current source 358 and ground 360. Emitter 336 of switching transistor Q32 is coupled with a resistor R32 in series with a current source 358 and ground 360. Resistors R31, R32 limit current spikes when switching transistors Q31, Q32 switch on and off.

Indicator signals indicating whether a respective switching transistor Q31, Q32 is on or off are conveyed via lines 323, 325 to output circuit 315. Output circuit 315 includes follower transistors Q34, Q35. Collector 348 of follower transistor Q34 is coupled for receiving supply voltage Vcc. Collector 350 of follower transistor Q35 is coupled for receiving supply voltage Vcc. Emitter 354 of follower transistor Q34 is coupled with a current source 380. Current source 380 is coupled with ground 382. Emitter 356 of follower transistor Q35 is coupled with a current source 384. Current source 384 is coupled with ground 386. Current sources 380, 384 are conveniently situated in apparatus 310 to independently control speed of operation (i.e., switching speed) of follower transistors Q34, Q35 independent of the value of $R_{LOAD}$. Further, increasing current supplied by current sources 380, 384 to increase switching speed of follower transistors Q34, Q35 does not significantly contribute to power dissipation by apparatus 310.

A load resistor $R_{LOAD}$ and a load capacitor $C_{LOAD}$ are coupled in parallel across emitters 354, 356 of follower transistors Q34, Q35. Output loci 360, 362 are coupled at either end of load resistor $R_{LOAD}$. Positive component VOUT+ of the differential output signal is presented at output locus 362. Negative component VOUT− of the differential output signal is presented at output locus 360. Since base 344 of follower transistor Q34 is coupled with line 323 and base 346 of follower transistor Q35 is coupled with line 325, follower transistors Q34, Q35 are controlled by signals appearing on lines 323, 325. Recall that signals appearing on lines 323, 325 represent whether switching transistors Q31, Q32 are on or off. As a result, output circuit 315 follows switching circuit 312 in operating follower transistors Q34, Q35.

Control circuit 314 operates to control common mode voltage of the output of apparatus 310. Control circuit 314 includes resistors R36, R37 coupled in series across emitters 354, 356 of follower transistors Q34, Q35. A feedback line 370 is coupled with a juncture 368 between resistors R36, R37. Feedback line 370 is coupled with an amplifier 372 in control circuit 314. Amplifier 372 also receives a reference voltage $V_{REF}$. Amplifier 372 presents an amplified error signal at an output line 374 representing the difference between a signal appearing on feedback line 370 and reference voltage $V_{REF}$. Line 374 is coupled with gate 390 of switching transistor Q33. Source 392 of switching transistor Q33 is coupled to receive supply voltage Vcc. Drain 394 of switching transistor Q33 is coupled with a bypass capacitor C31 and thence to ground 376. Drain 394 of switching transistor Q33 is also coupled with resistors R33, R34.

Preferably apparatus 310 is configured so that node 333 acts as a virtual ground because capacitor C1 is large enough to cause such a result.

Amplified error signals on line 374 are employed to gatingly control application of supply voltage Vcc to switching transistors Q31, Q32. That gating action affects signals appearing on lines 323, 325 which in turn affects operation of follower transistors Q34, Q35. When properly selected, transistor Q33 may operate effectively as an adjustable resistor to determine common mode voltage at output loci 360, 362. In such manner, amplified error signals on line 374 effect control of common mode voltage appearing at output loci 360, 362.

Apparatus 310 overcomes the limitations of prior art driver apparatuses and the need for having either high or low common mode output voltages. Apparatus 310, for the same power dissipation, generates significantly lower rise and fall times than apparatus 10 (FIG. 1) and apparatus 110 (FIG. 2). Apparatus 310 has three blocks, or circuits: a switching block, a follower block and a control block. In switching block 312 input signals received at input loci 320, 322 switch current between switching transistors Q31, Q32. Resistors R31, R32 are used as degenerators to limit bias current spikes when switching transistors Q31, Q32 are switched on and off. The differential voltage output from switching circuit 312 is provided to output circuit 315 on lines 323, 325. Output circuit 315 operates as a follower stage.

The resistive impedance seen at nodes 329, 331 (at the ends of lines 323, 325 distal from follower transistors Q34, Q35) can be adjusted to any small values. The capacitance seen at nodes 329, 331 comes from effective capacitance of $C_{be}$ (base-to-emitter capacitance) for a respective follower transistor Q34, Q35 coupled with $C_{LOAD}$ and any parasitic capacitances. Thus, the effective capacitance seen at nodes 329, 331 is smaller than $C_{LOAD}$ by a factor depending upon the relative values of $C_{be}$, $C_{LOAD}$ and $\beta$ (current gain of the respective bipolar follower transistor Q34, Q35).

The low resistances and capacitances seen at nodes 329, 331 result in faster rise and fall times and hence higher data rates for apparatus 310. Another advantage of apparatus 310 is the facility with which apparatus 310 can be programmed or reconfigured to accommodate various parameters, such as parameters for conforming to predetermined standards, with little change in the design or topology of apparatus 310. For example, simply by changing values for resistors R33, R34 any differential voltage can be obtained at output loci 360, 362 for conforming to a standard. Other parameters important to standard adherence are also easily changed.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

We claim:

1. An apparatus for conveying a communication signal from a first component to a second component; the apparatus comprising:

(a) a switching circuit coupled with said first component; said switching circuit receiving said communication signal from said first component; said switching circuit responding to said communication signal to generate an interim signal; said interim signal being representative of said communication signal; and (b) a follower circuit coupled at an input locus with said switching circuit and coupled at an output locus with said second component; said follower circuit receiving said interim signal at said input locus, said follower circuit generating an output signal at said output locus; said output signal substantially duplicating said communication signal; said follower circuit including a plurality of follower transistors for effecting said duplicating; each respective follower transistor of said plurality of follower transistors having a respective current source controlling current through said respective follower transistor, a control circuit; said control circuit coupling said follower circuit with said switching circuit; said control circuit receiving a feedback signal from said follower circuit; said feedback signal being representative of said output signal; said control circuit responding to said feedback signal to effect operation of said switching circuit to control at least one first parameter relating to said interim signal.

2. An apparatus for conveying a communication signal from a first component to a second component as recited in claim 1 wherein said output signal is presented at said output locus at a substantially constant current.

3. An apparatus for conveying a communication signal from a first component to a second component as recited in claim 2 wherein said control circuit effects said operation to urge at least one second parameter relating to said feedback signal toward at least one predetermined value limit.

4. An apparatus for conveying a communication signal from a first component to a second component as recited in claim 1 wherein said communication signal exhibits signal variations; said signal variations being at least partially manifested as timing variations and amplitude variations; said interim signal substantially faithfully emulating at least said timing variations.

5. An apparatus for conveying a communication signal from a first component to a second component as recited in claim 1 wherein said communication signal exhibits signal variations; said signal variations being at least partially manifested as timing variations and amplitude variations; said interim signal substantially faithfully emulating at least said timing variations and said amplitude variations.

6. An apparatus for conveying a communication signal from a first component to a second component as recited in claim 1 wherein said communication signal exhibits signal variations; said signal variations being at least partially manifested as timing variations and amplitude variations; said interim signal substantially faithfully emulating at least said timing variations.

7. An apparatus for conveying a communication signal from a first component to a second component as recited in claim 1 wherein said communication signal exhibits signal variations; said signal variations being at least partially manifested as timing variations and amplitude variations; said interim signal substantially faithfully emulating at least said timing variations and said amplitude variations.

8. An apparatus for effecting high speed switching of a communication signal between a first component and a second component; the apparatus comprising:

(a) a switching circuit configured for receiving said communication signal from said first component; said switching circuit including a plurality of switch elements; said plurality of switch elements responding to said communication signal to produce an interim signal; said interim signal being substantially a model of said communication signal; and (b) a follower circuit having an input locus coupled with said switching circuit for receiving said interim signal; said follower circuit having an output locus configured for presenting an output signal; said follower circuit generating an output signal at said output locus; said output signal substantially duplicating said communication signal; said follower circuit including a plurality of follower transistors for effecting said duplicating; each respective follower transistor of said plurality of follower transistors having a respective current source controlling current through said respective follower transistor, a control circuit; said control circuit coupling said follower circuit with said switching circuit; said control circuit receiving a feedback signal from said follower circuit; said feedback signal being representative of said output signal; said control circuit responding to said feedback signal to effect operation of said switching circuit to control at least one first parameter relating to said interim signal.

9. An apparatus for effecting high speed switching of a communication signal between a first component and a second component as recited in claim 8 wherein said output signal is presented at said output locus at a substantially constant current.

10. An apparatus for conveying a communication signal from a first component to a second component as recited in claim 9 wherein said control circuit effects said operation to urge at least one second parameter relating to said feedback signal toward at least one predetermined value limit.

11. An apparatus for conveying a communication signal from a first component to a second component as recited in claim 8 wherein said communication signal exhibits signal variations; said signal variations being at least partially manifested as timing variations and amplitude variations; said interim signal substantially faithfully emulating at least said timing variations.

12. An apparatus for conveying a communication signal from a first component to a second component as recited in claim 8 wherein said communication signal exhibits signal variations; said signal variations being at least partially manifested as timing variations and amplitude variations; said interim signal substantially faithfully emulating at least said timing variations and said amplitude variations.

13. An apparatus for conveying a communication signal from a first component to a second component as recited in claim 8 wherein said communication signal exhibits signal variations; said signal variations being at least partially manifested as timing variations and amplitude variations; said interim signal substantially faithfully emulating at least said timing variations.

14. An apparatus for conveying a communication signal from a first component to a second component as recited in claim 8 wherein said communication signal exhibits signal variations; said signal variations being at least partially manifested as timing variations and amplitude variations; said interim signal substantially faithfully emulating at least said timing variations and said amplitude variations.

15. An apparatus for effecting high speed switching of a communication signal between a first component and a second component; the apparatus comprising:

(a) a switching circuit configured for receiving said communication signal from said first component; said switching circuit including a plurality of switch elements; said plurality of switch elements responding to said communication signal to produce an interim signal; said interim signal being substantially a model of said communication signal;

(b) a follower circuit having an input locus coupled with said switching circuit for receiving said interim signal; said follower circuit having an output locus configured for presenting an output signal; said output signal substantially duplicating said interim signal; and (c) a control circuit; said control circuit coupling said follower circuit with said switching circuit; said control circuit receiving a feedback signal from said follower circuit; said feedback signal being representative of said output signal; said control circuit responding to said feedback signal to effect operation of said switching circuit to control at least one first parameter relating to said interim signal.

16. An apparatus for effecting high speed switching of a communications signal between a first component and a second component as recited in claim 15 wherein said output signal is presented at said output locus at a substantially constant current.

17. An apparatus for conveying a communication signal from a first component to a second component as recited in claim 16 wherein said control circuit effects said operation to urge at least one second parameter relating to said feedback signal toward at least one predetermined value limit.

18. An apparatus for conveying a communication signal from a first component to a second component as recited in claim 15 wherein said communication signal exhibits signal variations; said signal variations being at least partially manifested as timing variations and amplitude variations; said interim signal substantially faithfully emulating at least said timing variations.

* * * * *